US012690128B2

(12) United States Patent
Oka et al.

(10) Patent No.: US 12,690,128 B2
(45) Date of Patent: Jul. 21, 2026

(54) SUBSTRATE FOR PRINTED CIRCUIT BOARD AND PRINTED CIRCUIT BOARD

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Yoshio Oka, Osaka (JP); Kazuhiro Miyata, Osaka (JP); Motohiko Sugiura, Osaka (JP); Satoshi Kiya, Shiga (JP); Koji Nitta, Osaka (JP)

(73) Assignees: SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 0 days.

(21) Appl. No.: 18/872,378

(22) PCT Filed: Jun. 13, 2023

(86) PCT No.: PCT/JP2023/021821
§ 371 (c)(1),
(2) Date: Dec. 6, 2024

(87) PCT Pub. No.: WO2023/243619
PCT Pub. Date: Dec. 21, 2023

(65) Prior Publication Data
US 2025/0365861 A1     Nov. 27, 2025

(30) Foreign Application Priority Data
Jun. 16, 2022     (JP) ................................. 2022-097564

(51) Int. Cl.
*H05K 1/03* (2006.01)

(52) U.S. Cl.
CPC ..... *H05K 1/0373* (2013.01); *H05K 2201/015* (2013.01); *H05K 2201/0209* (2013.01); *H05K 2201/0344* (2013.01)

(58) Field of Classification Search
CPC ............................................... H05K 2201/015
See application file for complete search history.

(56) References Cited

U.S. PATENT DOCUMENTS

| | | | | |
|---|---|---|---|---|
| 4,849,284 A | * | 7/1989 | Arthur ................. | H05K 1/0373 428/405 |
| 5,055,342 A | * | 10/1991 | Markovich .......... | H05K 1/0373 428/209 |
| 2017/0327630 A1 | * | 11/2017 | Kiya ...................... | C08G 59/30 |
| 2019/0215957 A1 | | 7/2019 | Kaimori et al. | |

FOREIGN PATENT DOCUMENTS

| | | |
|---|---|---|
| JP | 2006069074 A | 3/2006 |
| JP | 2016079346 A | 5/2016 |
| WO | 2019031071 A1 | 2/2019 |

* cited by examiner

*Primary Examiner* — Ian A Rummel
(74) *Attorney, Agent, or Firm* — Renner, Otto, Boisselle & Sklar, LLP

(57) ABSTRACT

A substrate for a printed circuit board includes a base film having a main surface and an electrically conductive layer disposed on the main surface. The base film is made of a fluororesin. The electrically conductive layer is a layer including a plurality of electrically conductive particles bonded together. An amount of nitrogen present in the main surface is 0.2 atomic percent or more.

12 Claims, 6 Drawing Sheets

200

100

100

SUBSTRATE FOR PRINTED CIRCUIT BOARD AND PRINTED CIRCUIT BOARD

TECHNICAL FIELD

The present disclosure relates to a substrate for printed circuit board and a printed circuit board. This application claims priority based on Japanese Patent Application No. 2022-097564 filed on Jun. 16, 2022, and the entire contents of the Japanese patent application are incorporated herein by reference.

BACKGROUND ART

Japanese Unexamined Patent Application Publication No. 2006-69074 (patent literature 1) describes a composite film. The composite film described in patent literature 1 includes a resin film and a metal layer. The resin film has a main surface. The resin film is made of, for example, fluororesin. The metal layer is disposed on the main surface of the resin film. The metal layer is made of sputtering.

CITATION LIST

Patent Literature

Patent literature 1: Japanese Unexamined Patent Application Publication No. 2006-69074

SUMMARY OF INVENTION

A substrate for printed circuit board of the present disclosure includes a base film having a main surface, and an electrically conductive layer disposed on the main surface. The base film is made of a fluororesin. The electrically conductive layer is a layer including a plurality of electrically conductive particles bonded together. An amount of nitrogen present in the main surface is 0.2 atomic percent or more.

DETAILED DESCRIPTION

Figure 1:
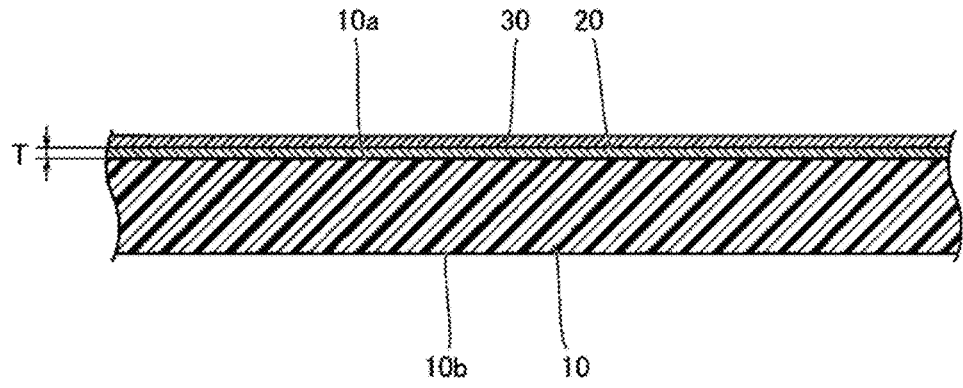
FIG. 1 is a cross-sectional view of a substrate for printed circuit board 100.

Problems to be Solved by Present Disclosure

In the composite film described in patent literature 1, a water-soluble fluoride is formed at the interface between the metal layer and the resin film during sputtering. When a printed circuit board is formed by a semi-additive method using the composite film described in patent literature 1, it is necessary to remove a part of the metal layer which does not constitute the wire by wet etching. The fluoride corrodes the metal layer constituting the wire during the wet etching. The corrosion of the metal layer constituting the wire causes a decrease in adhesion between the wire and the base film.

The present disclosure has been made in view of the problems associated with the conventional techniques described above. More specifically, the present disclosure provides a substrate for printed circuit board that can improve the adhesion of wires.

Advantageous Effects of Present Disclosure

According to the substrate for printed circuit board of the present disclosure, it is possible to improve the adhesion of the wire.

DESCRIPTION OF EMBODIMENTS OF PRESENT DISCLOSURE

First, embodiments of the present disclosure will be listed and described.

(1) A substrate for printed circuit board according to an embodiment includes a base film having a main surface, and an electrically conductive layer disposed on the main surface. The base film is made of a fluororesin. The electrically conductive layer is a layer including a plurality of electrically conductive particles bonded together. An amount of nitrogen present in the main surface is 0.2 atomic percent or more.

According to the substrate for printed circuit board of the above (1), it is possible to improve the adhesion of the wire.

(2) In the substrate for printed circuit board according to (1), the electrically conductive particles may be particles containing copper or silver as a main component.

(3) In the substrate for printed circuit board according to (1) or (2), a thickness of the electrically conductive layer may be 0.05 $\mu$m to 2.0 $\mu$m.

(4) In the substrate for printed circuit board according to (1) to (3), an average particle diameter of the electrically conductive particles may be 1 nm to 500 nm.

(5) The substrate for printed circuit board according to (1) to (4) may further include a copper plating layer disposed on the electrically conductive layer.

(6) In the substrate for printed circuit board according to (5), the copper plating layer may be an electroless copper plating layer or an electrolytic copper plating layer.

(7) In the substrate for printed circuit board according to (1) to (6), the base film may be made of a fluororesin containing a filler.

(8) In the substrate for printed circuit board according to (7), the filler may be made of silica.

(9) In the substrate for printed circuit board according to (1) to (8), the fluororesin is a polytetrafluoroethylene.

(10) A printed circuit board according to an embodiment includes a base film having a main surface, and a wire disposed on the main surface. The base film is made of a fluororesin. The wire includes an electrically conductive layer disposed on the main surface. The electrically conductive layer is a layer including a plurality of electrically conductive particles bonded together. An amount of nitrogen present in the main surface is 0.2 atomic percent or more.

Details of Embodiments of Present Disclosure

The details of embodiments of the present disclosure will be described with reference to the drawings. In the drawings, the same or corresponding parts are denoted by the same reference numerals, and the description thereof will not be repeated. Hereinafter, the substrate for printed circuit board according to the embodiment is referred to as a substrate for printed circuit board 100, and the printed circuit board according to the embodiment is referred to as a printed circuit board 200.

(Configuration of Substrate for Printed Circuit Board 100)

Hereinafter, the configuration of substrate for printed circuit board 100 will be described.

FIG. 1 is a cross-sectional view of substrate for printed circuit board 100. As shown in FIG. 1, substrate for printed circuit board 100 includes a base film 10, an electrically conductive layer 20, and a copper plating layer 30.

Base film 10 has a first main surface 10a and a second main surface 10b. First main surface 10a and second main surface 10b are end surfaces of base film 10 in the thickness direction. Second main surface 10b is a surface opposite to first main surface 10a.

Base film 10 is made of fluororesin. The fluororesin is, for example, polytetrafluoroethylene (PTFE). However, the fluororesin used for base film 10 is not limited to this. The fluororesin used for base film 10 may be PFA (tetrafluoroethylene-perfluoroalkyl vinyl ether copolymer) or FEP (tetrafluoroethylene-hexafluoropropylene copolymer). Base film 10 may be made of fluororesin containing a filler. The filler may be silica. However, the filler may be made of other materials.

The filler may be spherical. The average particle diameter of the filler may be 0.3 μm to 4.0 μm. The average particle diameter of the filler is measured by observing a cross section using a scanning electron microscope (SEM) and averaging the particle diameters of the filler observed in the cross section. The particle diameter of the filler may be calculated manually from the SEM image or may be calculated by image processing. The area of the cross section is 20 μm×20 μm. The method for preparing the sample for the cross section observation is not particularly limited, but the sample is prepared using, for example, a cross section polisher (registered trademark) manufactured by JEOL Ltd. for accurate measurement of the particle diameter. The volume ratio of the filler to the fluororesin may be 1.2 or more, or may be 1.5 or more.

The filler and electrically conductive layer 20 may be in contact with each other, or may have a distance between the filler and electrically conductive layer 20. When there is a distance between the filler and electrically conductive layer 20, the fluororesin may be present between the filler and electrically conductive layer 20. The distance may be 0.01 μm to 0.5 μm, or may be 0.05 μm to 0.3 μm. In an arbitrary cross section orthogonal to first main surface 10a, the sum of the lengths of the fluororesin layers in the direction parallel to first main surface 10a within the range of the distance (0.01 μm to 0.5 μm) between the filler and electrically conductive layer 20 may be 5% or more, or may be 10% or more, of the entire length of first main surface 10a in the cross section. In this case, the effect of improving the adhesion is sufficiently secured.

Electrically conductive layer 20 is disposed on first main surface 10a. The thickness of electrically conductive layer 20 is T. T may be 0.05 μm to 2.0 μm. When the thickness of electrically conductive layer 20 is less than 0.05 μm, the conductivity is insufficient, and thus, in an electroplating step (S5) described later, the electrolytic plating layer may be damaged or the variation in the thickness distribution of the electrolytic plating layer may become large. When the thickness of electrically conductive layer 20 exceeds 2.0 μm, the amount of etching in an etching step (S7) described later becomes too large, and the variation in circuit width due to the variation in etching becomes large.

Electrically conductive layer 20 is a layer of a plurality of electrically conductive particles bonded together. The thickness of electrically conductive layer 20 can be measured by the following method. The sample is embedded in a resin, and the machined surface is preliminarily finished by mechanical polishing. A cross-sectional processing using Ar ion beam (cross section polisher) is performed on the machined surface, followed by a 2 nm carbon coating. The thickness of electrically conductive layers 20 are measured in the obtained images using a high-resolution scanning electron microscope (manufactured by Hitachi High-Technologies Corporation, SU8020). The thickness is an average value of measured values at arbitrary 10 points.

Electrically conductive layer 20 is a porous material. In electrically conductive layer 20, two adjacent electrically conductive particles are bonded together. The electrically conductive particles which are bonded together may be sintered. In electrically conductive layer 20, there may be a portion where two adjacent electrically conductive particles are not bonded together. The plurality of electrically conductive particles at the interface with first main surface 10a are fixed to first main surface 10a. However, some of the plurality of electrically conductive particles at the interface with first main surface 10a may not be fixed to first main surface 10a.

The electrically conductive particles are made of a conductive material. The electrically conductive particle is a particle whose main component is, for example, copper (Cu). The electrically conductive particle may be a particle in which a main component is silver (Ag). It is noted that, copper being the main component of the electrically conductive particles means that the copper content in the electrically conductive particles exceeds 50 mass percent. The same applies when using silver. Electrically conductive layer 20 may contain a plurality of types of electrically conductive particles made of different materials. The average particle diameter of the electrically conductive particles is, for example, 1 nm to 500 nm. When the average particle diameter of the electrically conductive particles is less than 1 nm, the conductivity is reduced because oxidation is likely to proceed. Further, in electroplating step (S5) described below, the electrolytic plating layer may be damaged or the thickness distribution of the electrolytic plating layer may become large. When the average particle diameter of the electrically conductive particles exceeds 500 nm, the conductivity is reduced because the bonding between the particles by sintering is difficult to be achieved. Further, in electroplating step (S5) described below, the electrolytic plating layer may be damaged or the thickness distribution of the electrolytic plating layer may become large. The average particle diameter of the electrically conductive particles is measured by a particle size distribution analyzer (for example, a Microtrac particle size distribution analyzer UPA-150EX manufactured by Nikkiso Co., Ltd.).

The amount of nitrogen present in first main surface 10a is 0.2 atomic percent or more. The amount of nitrogen present in first main surface 10a is measured by XPS (X-ray photoelectron spectroscopy) analysis. More particularly, electrically conductive layer 20 disposed on first main surface 10a is removed using an acidic solvent, and then XPS analysis is performed on first main surface 10a. The amount of nitrogen present per unit surface in first main surface 10a is obtained based on the peak areas of the spectrum showing the is orbit of nitrogen obtained as a result.

Copper plating layer 30 is disposed on electrically conductive layer 20. Copper plating layer 30 is a copper layer made of plating. Copper plating layer 30 is, for example, an electroless copper plating layer, that is, a copper layer made of electroless plating. Copper plating layer 30 may be an electrolytic copper plating layer, that is, a copper layer made of electrolytic plating. It is noted that, substrate for printed circuit board 100 may not include copper plating layer 30.

Modification

Figure 2:
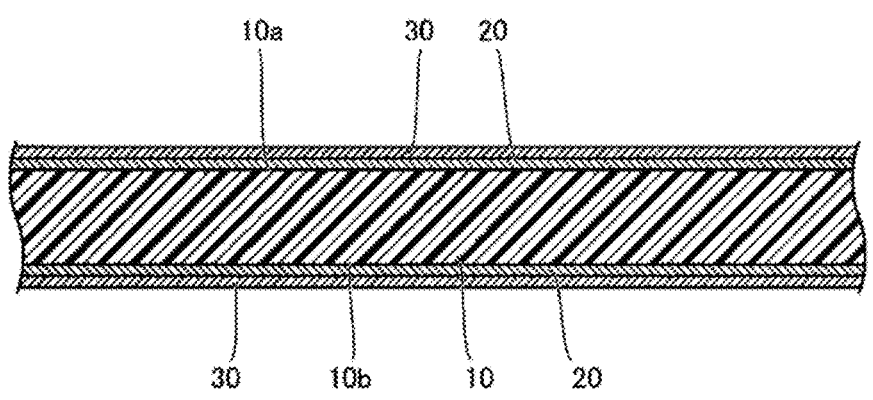
FIG. 2 is a cross-sectional view of a modification of substrate for printed circuit board 100.

FIG. 2 is a cross-sectional view of a modification of substrate for printed circuit board 100. As shown in FIG. 2, in substrate for printed circuit board 100, electrically conductive layer 20 may be disposed on second main surface 10b as well. Further, when electrically conductive layer 20 is disposed on second main surface 10b, copper plating layer 30 may be disposed on electrically conductive layer 20 on second main surface 10b.

(Manufacturing Method of Substrate for Printed Circuit Board 100)

Hereinafter, a manufacturing method of substrate for printed circuit board 100 will be described.

Figure 3:
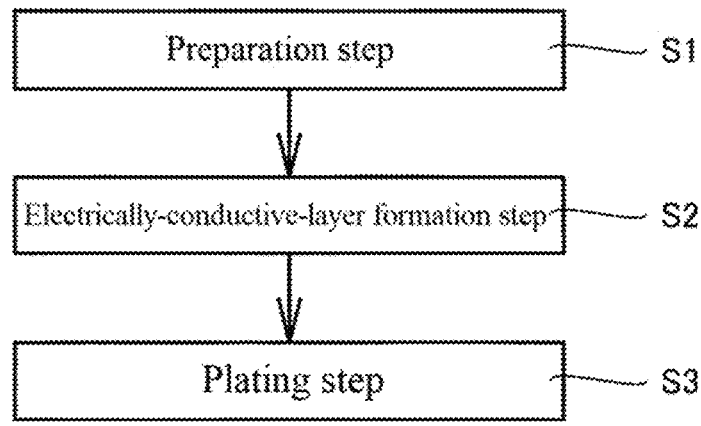
FIG. 3 is a manufacturing step view of substrate for printed circuit board 100.

FIG. 3 is a manufacturing step view of substrate for printed circuit board 100. As shown in FIG. 3, the manufacturing method of substrate for printed circuit board 100 includes a preparation step S1, an electrically-conductive-layer formation step S2, and a plating step S3. Electrically-conductive-layer formation step S2 is performed after preparation step S1. Plating step S3 is performed after electrically-conductive-layer formation step S2. It is noted that, when substrate for printed circuit board 100 does not include copper plating layer 30, plating step S3 is omitted.

Figure 4:
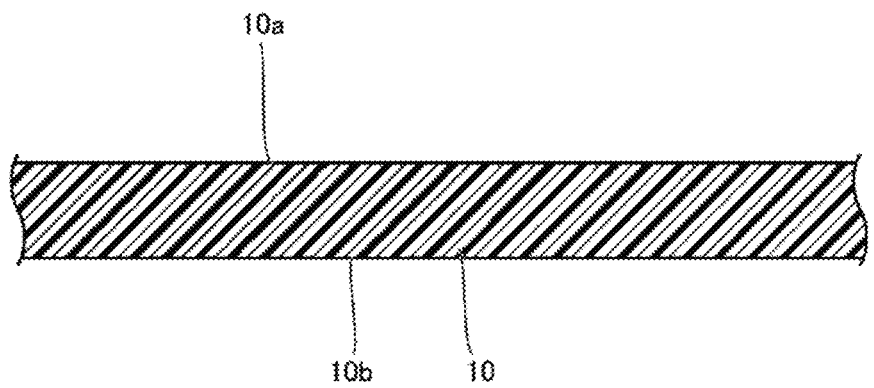
FIG. 4 is a cross-sectional view for explaining a preparation step S1.

FIG. 4 is a cross-sectional view for explaining preparation step S1. As shown in FIG. 4, in preparation step S1, base film 10 is prepared. It is noted that, in base film 10 prepared in preparation step S1, electrically conductive layer 20 is not formed on first main surface 10a. Further, base film 10 prepared in preparation step S1 may or may not be subjected to pretreatment (for example, alkali treatment or plasma treatment) on first main surface 10a before being subjected to electrically-conductive-layer formation step S2.

Figure 5:
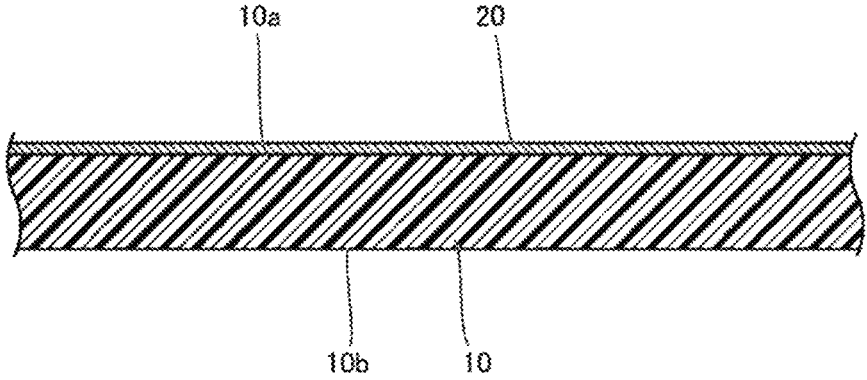
FIG. 5 is a cross-sectional view for explaining an electrically-conductive-layer formation step S2.

FIG. 5 is a cross-sectional view explaining electrically-conductive-layer formation step S2. In electrically-conductive-layer formation step S2, as shown in FIG. 5, electrically conductive layer 20 is formed on first main surface 10a. In electrically-conductive-layer formation step S2, firstly, an ink containing a plurality of electrically-conductive particles dispersed is applied to first main surface 10a. The electrically conductive particles contained in the ink are coated with an organic material on the surface thereof. The organic material contains nitrogen and hydrogen.

In electrically-conductive-layer formation step S2, secondly, heating and pressing are performed to the ink that has been applied to first main surface 10a. The heating and pressing are performed under a vacuum environment. The heating and pressing are performed using, for example, a vacuum press machine. The heating and pressing volatilize solvents in the ink and decompose organic materials coating the surfaces of the electrically conductive particles, thereby causing the electrically conductive particles to be sintered and fixed to first main surface 10a. In this way, electrically conductive layer 20 is formed on first main surface 10a. It is noted that, when the pressing is performed, a plate member made of a metal material such as aluminum is disposed between the head of the vacuum press machine and the ink.

In plating step S3, copper plating layer 30 is formed on electrically conductive layer 20. Copper plating layer 30 is formed by, for example, electroless plating. Copper plating layer 30 may be formed by electrolytic plating. Thus, substrate for printed circuit board 100 having the structure shown in FIG. 1 is formed.

Modification

In the above example, in electrically-conductive-layer formation step S2, an ink containing electrically conductive particles dispersed are applied to first main surface 10a, but ink may be applied to the surface of a plate member made of a metal material such as aluminum. In this case, base film 10 is disposed on the applied ink, and then heating and pressing are performed to the ink. It is noted that, when ink is applied to the surface of the plate member made of a metal material such as aluminum, ink is less likely to be repelled than when ink is applied to the surface of base film 10 made of fluororesin.

(Configuration of Printed Circuit Board 200)

The configuration of printed circuit board 200 will be described below.

Figure 6:
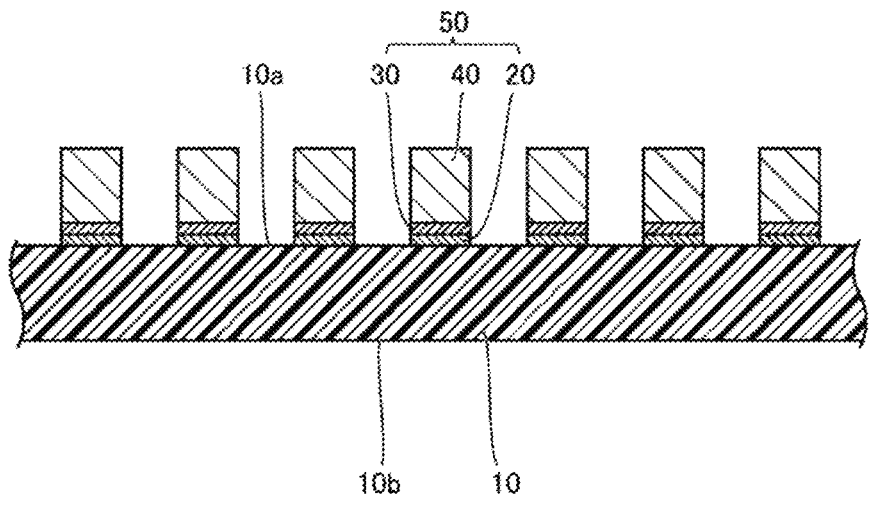
FIG. 6 is a cross-sectional view of a printed circuit board 200.

FIG. 6 is a cross-sectional view of printed circuit board 200. As shown in FIG. 6, printed circuit board 200 includes base film 10 and wires 50. Wire 50 is disposed on first main surface 10a. Wire 50 includes electrically conductive layer 20, copper plating layer 30, and an electrolytic copper plating layer 40. Electrolytic copper plating layer 40 is disposed on copper plating layer 30. Electrolytic copper plating layer 40 is a copper layer made of electrolytic plating. Printed circuit board 200 may not include copper plating layer 30.

Figure 7:
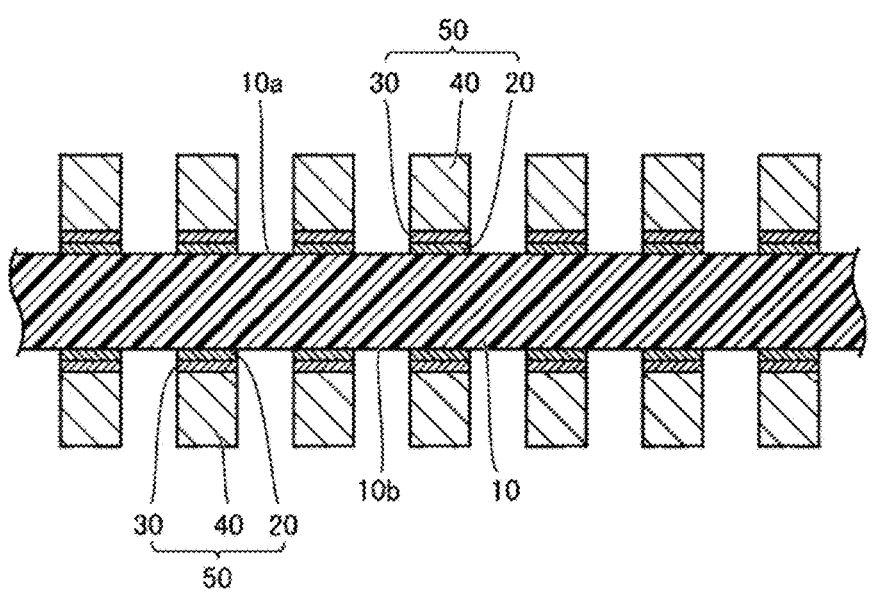
FIG. 7 is a cross-sectional view of a modification of printed circuit board 200.

FIG. 7 is a cross-sectional view of a modification of printed circuit board 200. As shown in FIG. 7, in printed circuit board 200, wire 50 may be disposed on second main surface 10b. In this case, printed circuit board 200 may not include copper plating layer 30.

(Manufacturing Method of Printed Circuit Board 200)

Hereinafter, a manufacturing method of printed circuit board 200 will be described.

Figure 8:
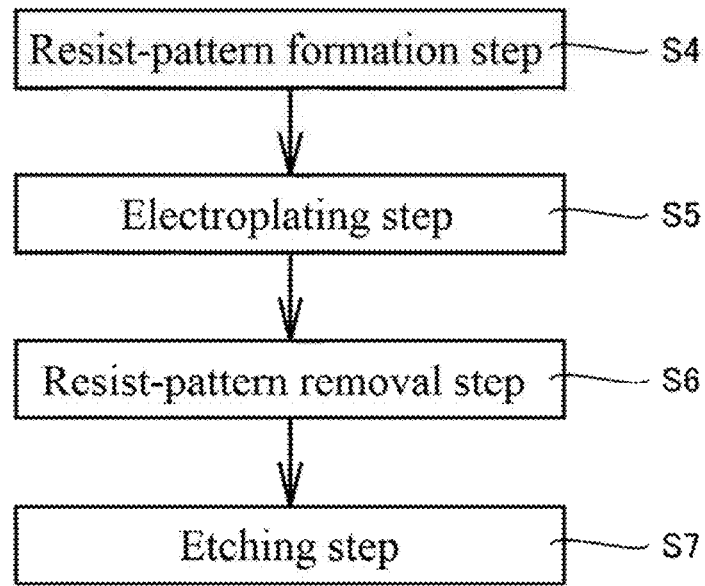
FIG. 8 is a manufacturing step view of printed circuit board 200.

FIG. 8 is a manufacturing step view of printed circuit board 200. As shown in FIG. 8, the manufacturing method of printed circuit board 200 includes a resist-pattern formation step S4, electroplating step S5, a resist-pattern removal step S6, and etching step S7. Printed circuit board 200 is formed using substrate for printed circuit board 100.

Figure 9:
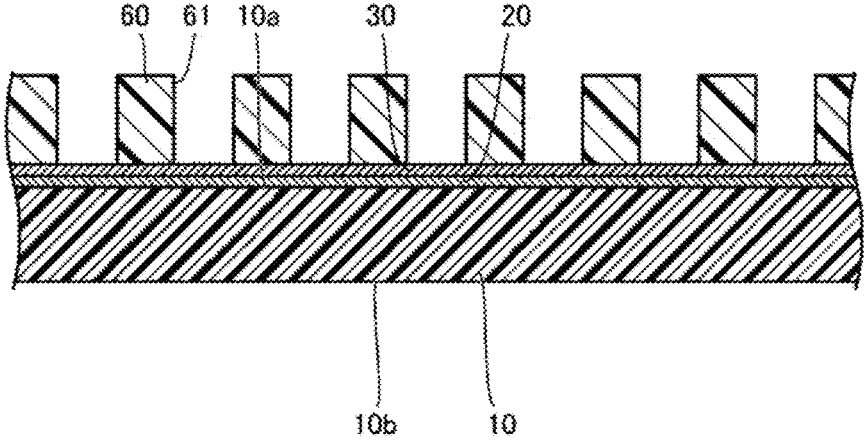
FIG. 9 is a cross-sectional view for explaining a resist-pattern formation step S4.

FIG. 9 is a cross-sectional view for explaining resist-pattern formation step S4. As shown in FIG. 9, in resist-pattern formation step S4, a resist pattern 60 is formed on electrically conductive layer 20. Resist pattern 60 has an opening portion 61. Copper plating layer 30 is exposed from opening portion 61. Resist pattern 60 is formed by, for example, exposing and developing a dry film resist to pattern the resist. It is noted that, when printed circuit board 200 does not include copper plating layer 30, electrically conductive layer 20 is exposed from opening portion 61.

Figure 10:
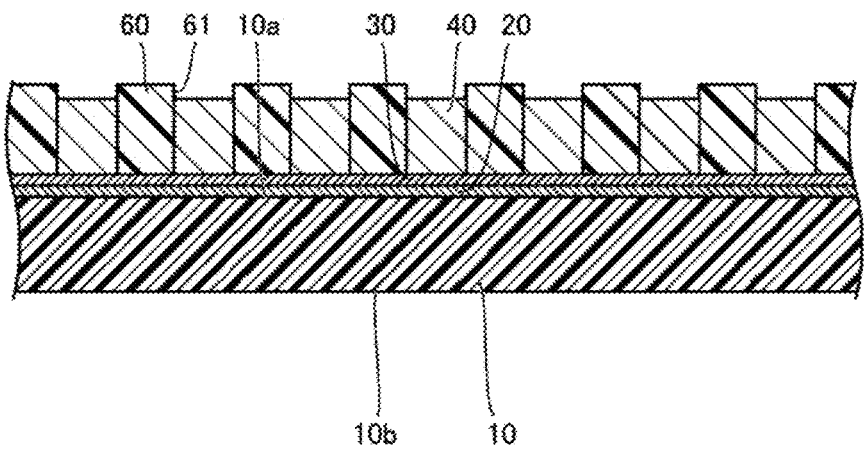
FIG. 10 is a cross-sectional view for explaining an electroplating step S5.

FIG. 10 is a cross-sectional view for explaining electroplating step S5. As shown in FIG. 10, in electroplating step S5, electrolytic copper plating layer 40 is formed on copper plating layer 30 exposed from opening portion 61 (on electrically conductive layer 20 exposed from opening portion 61 in the case where copper plating layer 30 is not included). Electrolytic copper plating layer 40 is formed by performing electrolytic plating on copper plating layer 30 exposed from opening portion 61 by applying a current to electrically conductive layer 20 and copper plating layer 30.

Figure 11:
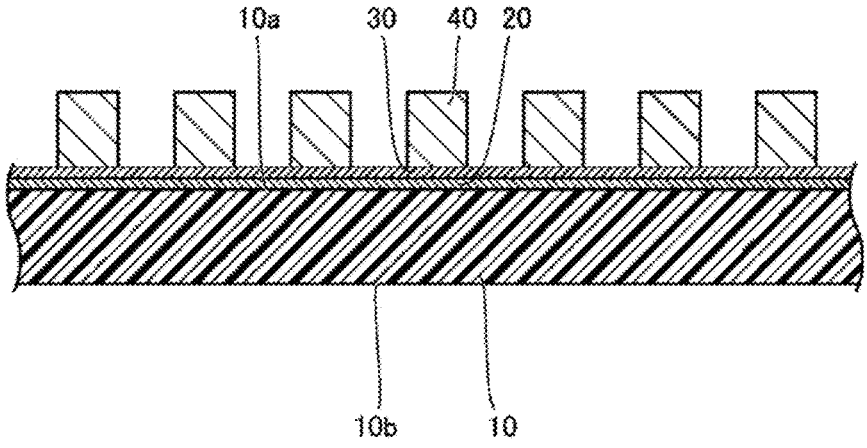
FIG. 11 is a cross-sectional view for explaining a resist-pattern removal step S6.

FIG. 11 is a cross-sectional view for explaining resist-pattern removal step S6. As shown in FIG. 11, in resist-pattern removal step S6, resist pattern 60 is removed. In etching step S7, electrically conductive layer 20 and copper plating layer 30 between two adjacent electrolytic copper plating layers 40 are removed by wet etching. Thus, printed circuit board 200 having the structure shown in FIG. 6 is formed.

(Effect of Substrate for Printed Circuit Board 100)

Hereinafter, effects of substrate for printed circuit board 100 will be described.

In substrate for printed circuit board 100, during electrically-conductive-layer formation step S2, an organic material coating the surface of the electrically conductive particles reacts with fluorine contained in the fluororesin of base film 10, resulting in the formation of fluorine compounds. Since the organic material coating the surface of the electrically conductive particle contains hydrogen, the fluorine compounds are hydrogen fluorides. Since hydrogen fluoride is a gas, the fluorine compound generated in electrically-conductive-layer formation step S2 is discharged to the outside through electrically conductive layer 20 which is a porous material, and hardly remains at the interface between electrically conductive layer 20 and first main surface 10a. That is, electrically conductive layer 20 is not corroded unlike a water-soluble fluoride formed at an interface between the metal layer and the resin film when sputtering is performed.

When printed circuit board 200 is formed using substrate for printed circuit board 100, electrically conductive layer 20 that does not constitute wire 50 is removed by wet etching. In substrate for printed circuit board 100, the fluorine compound hardly remains at the interface between electrically conductive layer 20 and first main surface 10a, and thus electrically conductive layer 20 constituting wire 50 is hardly corroded when the wet etching is performed. Thus, according to substrate for printed circuit board 100, it is possible to suppress the peeling of wire 50.

It is noted that, in electrically-conductive-layer formation step S2, nitrogen contained in the organic material coating the surface of the electrically conductive particle at the interface with first main surface 10a is bonded to carbon contained in the fluororesin of base film 10, and thus electrically conductive layer 20 is fixed to first main surface 10a. Thus, when the amount of nitrogen present in first main surface 10a is measured by XPS analysis after electrically conductive layer 20 is removed by an acidic solution, the amount of nitrogen present in first main surface 10a is 0.2 atomic percent or more. Thus, in substrate for printed circuit board 100 and printed circuit board 200, the adhesion between base film 10 and electrically conductive layer 20 is excellent. It is noted that, QuanteraSXM manufactured by ULVAC PHI, Inc. was used as an apparatus for XPS analysis, and X-ray irradiation conditions were 100 amp, 25 W, and 15 kV.

In the case where base film 10 is made of fluororesin containing a filler, base film 10 is less likely to be deformed when the pressing is performed in electrically-conductive-layer formation step S2, and thus the pressure is more uniformly applied to the ink. Thus, in this case, electrically conductive layer 20 can be formed more uniformly.

When the filler is made of silica, the cost of base film 10 can be reduced because silica is inexpensive. When the average particle diameter of the filler is 0.3 μm to 4.0 μm, it is possible to suppress the deformation of base film 10 during the pressing while reducing the increase in the unevenness of first main surface 10a (second main surface 10b) due to the pressing in electrically-conductive-layer formation step S2. When the volume ratio of the filler to the fluororesin is 1.2 or more, electrically conductive layer 20 may be more uniformly formed.

Figure 12:
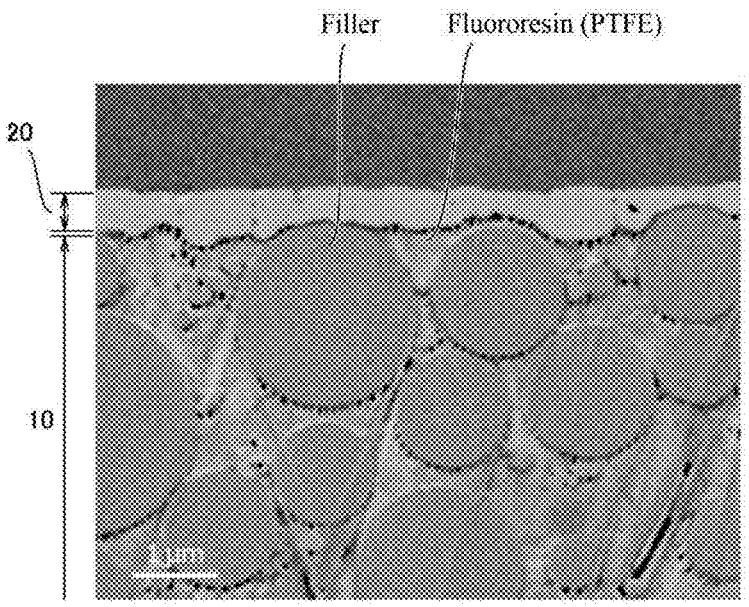
FIG. 12 is an SEM image of a cross section of substrate for printed circuit board 100.

FIG. 12 is an SEM image of a cross section of substrate for printed circuit board 100. FIG. 12 shows an SEM image in a cross section orthogonal to first main surface 10a. The cross section of FIG. 12 was processed using a cross section polisher (registered trademark). It is noted that, in FIG. 12, base film 10 is formed of PTFE containing a filler made of silica. As shown in FIG. 12, when the fluororesin is present between the filler and electrically conductive layer 20, a high pressing is performed between the fluororesin and electrically conductive layer 20 during the pressing in electrically-conductive-layer formation step S2, and the adhesion between electrically conductive layer 20 and base film 10 is improved. When the thickness of the fluororesin is less than 0.01 μm, electrically conductive layer 20 and the filler may come into contact with each other. When the thickness of the fluororesin is exceeds 0.5 μm, the pressure increasing effect is reduced. Thus, when the thickness of the fluororesin is 0.01 μm to 0.5 μm, the adhesion between electrically conductive layer 20 and base film 10 is particularly improved.

When the filler is spherical, a uniform distance between the filler and electrically conductive layer 20 is likely to be obtained along a part of the surface of the filler. Further, when the filler is spherical, the filler is less likely to break through electrically conductive layer 20 when the pressing is performed in electrically-conductive-layer formation step S2. In an arbitrary cross section orthogonal to first main surface 10a, when the length of the fluororesin layer between the filler and electrically conductive layer 20 along first main surface 10a is 5% or more of the width of the cross section, the effect of improving the adhesion is sufficiently secured. Alternatively, in an arbitrary cross section orthogonal to first main surface 10a, the total length of the fluororesin layer in the direction parallel to first main surface 10a within the range of the distance (0.01 μm to 0.5 μm) between the filler and electrically conductive layer 20 may be 5% or more, or 10% or more, of the entire length of first main surface 10a in the cross section. In this case, the effect of improving the adhesion is sufficiently secured.

Example

Sample 1 to sample 7 were prepared as examples, and sample 8 was prepared as a comparative example. In sample 1 to sample 6 and sample 8, base film 10 was made of PTFE containing a filler. Sample 7 was made of PTFE containing no filler.

In sample 1 to sample 4 and sample 6 to sample 7, copper particles with average particle diameter of 70 nm were used as the electrically conductive particles. In sample 5, copper particles with average particle diameter of 30 nm were used as electrically conductive particles.

In sample 1 to sample 8, the pressure applied to the ink was changed in electrically-conductive-layer formation step S2. In sample 8, this pressure is zero. That is, in sample 8, no pressure is applied to ink when electrically-conductive-layer formation step S2 is performed. In sample 1 to sample 8, the highest heating temperature (the highest heating temperature of the hot plate of the press apparatus) in electrically-conductive-layer formation step S2 was 350° C. Sample 1 to sample 8 were heated from room temperature to 350° C. at a temperature increase rate of 5° C./min, held at 350° C. for 10 minutes, and then cooled to room temperature at a temperature decrease rate of 5° C./min.

In sample 1 to sample 5, sample 7, and sample 8, ink was applied to first main surface 10a when electrically-conductive-layer formation step S2 was performed. In sample 6, ink was applied to the surface of the plate member made of aluminum when electrically-conductive-layer formation step S2 was performed. In sample 1 to sample 8, the preprocessing is not performed on first main surface 10a. Details of sample 1 to sample 8 are shown in table 1.

film was measured by XPS analysis after the copper layer was removed by etching using a copper etching solution containing 1 mol/L of copper chloride and 0.5 mol/L of hydrochloric acid. The XPS analysis was performed using QuanteraSXM manufactured by ULVAC PHI, Inc. as an apparatus under X-ray irradiation conditions of 100 μmφ, 25 W, 15 kV). The results of these measurements are shown in table 2.

TABLE 2

| Sample | Adhesion of electrically conductive layer 20 to first main surface 10a (N/cm) | Amount of nitrogen present in first main surface 10a (Atomic %) |
|---|---|---|
| 1 | 7.5 | 2.1 |
| 2 | 7.8 | 3.2 |
| 3 | 6.8 | 1.1 |
| 4 | 6.3 | 0.6 |
| 5 | 7.4 | 1.8 |
| 6 | 6.0 | 0.3 |
| 7 | 6.1 | 0.5 |
| 8 | 3.8 | 0.1 |

TABLE 1

Average particle diameter of

| Sample | Base film 10 | Electrically conductive particles | Average particle diameter of electrically conductive particles (nm) | The highest heating temperature (° C.) | Pressure (MPa) |
|---|---|---|---|---|---|
| 1 | PTFE containing a filler | Copper particles | 70 | 350 | 2.0 |
| 2 | PTFE containing a filler | Copper particles | 70 | 350 | 4.0 |
| 3 | PTFE containing a filler | Copper particles | 70 | 350 | 1.0 |
| 4 | PTFE containing a filler | Copper particles | 70 | 350 | 0.5 |
| 5 | PTFE containing a filler | Copper particles | 30 | 350 | 0.5 |
| 6 | PTFE containing a filler | Copper particles | 70 | 350 | 0.5 |
| 7 | PTFE containing no filler | Copper particles | 70 | 350 | 2.0 |
| 8 | PTFE containing a filler | Copper particles | 70 | 350 | 0 |

In sample 1 to sample 8, the amount of nitrogen present in first main surface 10a and the adhesion of electrically conductive layer 20 to first main surface 10a were measured. In the measurement of the adhesion of electrically conductive layer 20 to first main surface 10a, firstly, an electrolytic copper plating layer is formed on electrically conductive layer 20. At this time, the average value of the sum of the thickness of electrically conductive layer 20 and the thickness of the electrolytic copper plating layer is 20 μm. Secondly, base film 10 is fixed to a glass epoxy plate with a double-sided tape in accordance with JIS-C6471 (1995), and electrically conductive layer 20 and the electrolytic copper plating layer are peeled off in a direction of 180° with respect to base film 10. The measurement apparatus used was Autograph AGS-X/500N manufactured by Shimadzu Corporation, the sample width was 5 mm, the peeling rate was 50 mm/min, and the measurement temperature was 25±3° C. The peel strength at the time of peeling is regarded as the adhesion of electrically conductive layer 20 to first main surface 10a. The amount of nitrogen present in the base As shown in table 2, in sample 1 to sample 7, the amount of nitrogen present in first main surface 10a was 0.2 atomic percent or more. On the other hand, in sample 8, the amount of nitrogen present in first main surface 10a was less than 0.2 atomic percent. From this, it was found that the amount of nitrogen present in first main surface 10a was 0.2 atomic percent or more by performing the pressing in electrically-conductive-layer formation step S2.

The adhesion of electrically conductive layer 20 to first main surface 10a in each of the sample 1 to sample 7 was larger than the adhesion of electrically conductive layer 20 to first main surface 10a in sample 8. From this comparison, it is clear that the adhesion of electrically conductive layer 20, and thus the adhesion of wire 50, is improved by the amount of nitrogen present in first main surface 10a being 0.2 atomic percent or more.

The embodiments disclosed herein are illustrative in all respects and should not be construed as limiting. The scope of the present invention is defined by the appended claims rather than the foregoing embodiments, and is intended to include all modifications within the scope and meaning equivalent to the appended claims.

REFERENCE SIGNS LIST 10 base film
10a first main surface
10b second main surface
20 electrically conductive layer
30 copper plating layer
40 electrolytic copper plating layer
50 wire
60 resist pattern
61 opening portion
100 substrate for printed circuit board
200 printed circuit board
S1 preparation step
S2 electrically-conductive-layer formation step
S3 plating step
S4 resist-pattern formation step
S5 electroplating step
S6 resist-pattern removal step
S7 etching step
T thickness

The invention claimed is:

1. A substrate for a printed circuit board, the substrate comprising:

a base film having a main surface; and an electrically conductive layer disposed on the main surface, wherein the base film is made of a fluororesin containing a filler made of silica particles, wherein the electrically conductive layer is a layer including a plurality of electrically conductive particles bonded together, and wherein an amount of nitrogen present in the main surface is 0.2 atomic percent or more, wherein the base film includes a fluororesin layer between the filler and the electrically conductive layer, wherein, in a cross section orthogonal to the main surface, the fluororesin layer has a predetermined range of distance between the filler and the electrically conductive layer, and a total length of the fluororesin layer between the filler and electrically conductive layer in a direction parallel to the main surface within the range of the distance between the filler and the electrically conductive layer is 5% or more of an entire length of the main surface.

2. The substrate for a printed circuit board according to claim 1, wherein the electrically conductive particles are particles containing copper or silver as a main component.

3. The substrate for a printed circuit board according to claim 1, wherein a thickness of the electrically conductive layer is 0.05 μm to 2.0 μm.

4. The substrate for a printed circuit board according to claim 1, wherein an average particle diameter of the electrically conductive particles is 1 nm to 500 nm.

5. The substrate for a printed circuit board according to claim 1, the substrate further comprising a copper plating layer disposed on the electrically conductive layer.

6. The substrate for a printed circuit board according to claim 5, wherein the copper plating layer is an electroless copper plating layer or an electrolytic copper plating layer.

7. The substrate for a printed circuit board according to claim 1, wherein the fluororesin is a polytetrafluoroethylene.

8. The substrate for a printed circuit board according to claim 1, wherein an average particle diameter of the filler is 0.3 μm to 4.0 μm.

9. The substrate for a printed circuit board according to claim 1, wherein a volume ratio of the filler to the fluororesin is 1.2 or more.

10. The substrate for a printed circuit board according to claim 1, wherein the predetermined range of distance between the filler and the electrically conductive layer is between 0.01 μm to 0.5 μm.

11. A printed circuit board comprising:

a base film having a main surface; and a wire disposed on the main surface, wherein the base film is made of a fluororesin containing a filler made of silica particles, wherein the wire includes an electrically conductive layer disposed on the main surface, wherein the electrically conductive layer is a layer including a plurality of electrically conductive particles bonded together, wherein the base film includes a fluororesin layer between the filler and the electrically conductive layer, wherein, in a cross section orthogonal to the main surface, the fluororesin layer has a predetermined range of distance between the filler and the electrically conductive layer, and a total length of the fluororesin layer between the filler and electrically conductive layer in a direction parallel to the main surface within the range of the distance between the filler and the electrically conductive layer is 5% or more of an entire length of the main surface, and wherein an amount of nitrogen present in the main surface is 0.2 atomic percent or more.

12. The printed circuit board according to claim 11, wherein the predetermined range of distance between the filler and the electrically conductive layer is between 0.01 μm to 0.5 μm.

* * * * *